US011664065B2

(12) United States Patent
Yen

(10) Patent No.: US 11,664,065 B2
(45) Date of Patent: May 30, 2023

(54) DYNAMIC RANDOM-ACCESS MEMORY AND OPERATION METHOD THEREOF

(71) Applicant: NANYA TECHNOLOGY CORPORATION, New Taipei (TW)

(72) Inventor: Nung Yen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/518,575

(22) Filed: Nov. 3, 2021

(65) Prior Publication Data

US 2023/0135869 A1    May 4, 2023

(51) Int. Cl.
*G11C 11/406* (2006.01)

(52) U.S. Cl.
CPC ............... *G11C 11/40626* (2013.01)

(58) Field of Classification Search
CPC .............................. G11C 11/40626
USPC ......................................... 365/222
See application file for complete search history.

(56) References Cited

U.S. PATENT DOCUMENTS

| 7,221,609 | B1 | 5/2007 | Bains | |
| 2011/0055671 | A1* | 3/2011 | Kim | G11C 7/1069 365/194 |
| 2016/0365138 | A1* | 12/2016 | Cho | G11C 7/1072 |
| 2020/0027500 | A1 | 1/2020 | Heymann et al. | |

OTHER PUBLICATIONS

"DDR4 Sdram Standard", JEDEC Standard No. 79-4B, Jun. 2017, pp. 38-41.
"Office Action of Taiwan Counterpart Application", dated Mar. 21, 2023, pp. 1-8.

* cited by examiner

*Primary Examiner* — Anthan Tran
(74) *Attorney, Agent, or Firm* — JCIPRNET

(57) ABSTRACT

The invention provides a dynamic random-access memory (DRAM) and an operation method thereof. The DRAM includes a memory cell array, a temperature sensor, and a refresh logic circuit. The temperature sensor senses a temperature of the DRAM. The refresh logic circuit enters a tRFC based on a refresh command issued by a memory controller to perform an automatic refresh operation on at least one memory cell row of the memory cell array. In a temperature-controlled refresh mode, the refresh logic circuit correspondingly adjusts a number of a plurality of tRAS periods in the tRFC according to a temperature sensing result of the temperature sensor. In a fine granularity refresh mode, the refresh logic circuit correspondingly adjusts the number of the tRAS periods in the tRFC according to a granularity specified by the memory controller.

10 Claims, 3 Drawing Sheets

DYNAMIC RANDOM-ACCESS MEMORY AND OPERATION METHOD THEREOF

BACKGROUND OF THE INVENTION

Field of the Invention

The invention relates to a memory, and more particularly to a dynamic random-access memory (DRAM) and an operation method thereof.

Description of Related Art

Dynamic random-access memory (DRAM) standards, such as double-data-rate fourth generation synchronous dynamic random-access memory (DDR4 SDRAM) standard or other standards, regulate two functions for power consumption and instant current reduction at cold temperature. Regarding power consumption at low temperatures, the DRAM standards specify a temperature-controlled refresh (TCR) mode. In the TCR mode, the DRAM may determine which refresh command issued by the memory controller should be blocked (ignored or not executed) based on the temperature. In response to the instantaneous current reduction, the DRAM standards specify a fine granularity refresh (FGR) mode. In the FGR mode, the memory controller may divide one refresh command into two or four refresh commands. How to achieve the TCR mode and the FGR mode is one of many technical issues in the art.

SUMMARY OF THE INVENTION

The invention provides a dynamic random-access memory (DRAM) and an operation method thereof to achieve a temperature-controlled refresh (TCR) mode and a fine granularity refresh (FGR) mode.

In an embodiment of the invention, the DRAM includes a memory cell array, a temperature sensor, and a refresh logic circuit. The memory cell array includes a plurality of memory cell rows. The temperature sensor is configured to sense a temperature of the DRAM. The refresh logic circuit is coupled to the temperature sensor to receive a temperature sensing result. The refresh logic circuit is configured to enter a row refresh cycle time based on a refresh command issued by a memory controller to perform an automatic refresh operation on at least one of the memory cell rows. In a TCR mode, the refresh logic circuit correspondingly adjusts a number of periods of a plurality of row address strobe (RAS) active times in the row refresh cycle time according to the temperature sensing result. In an FGR mode, the refresh logic circuit correspondingly adjusts the number of periods of the RAS active times in the row refresh cycle time according to a granularity specified by the memory controller.

In an embodiment of the invention, the operation method includes: sensing a temperature of a dynamic random-access memory by a temperature sensor of the dynamic random-access memory; entering a row refresh cycle time based on a refresh command issued by a memory controller to perform an automatic refresh operation on at least one of a plurality of memory cell rows of a memory cell array of the dynamic random-access memory; adjusting a number of periods of a plurality of RAS active times in the row refresh cycle time correspondingly via a refresh logic circuit of the dynamic random-access memory according to a temperature sensing result of the temperature sensor in a temperature-controlled refresh mode; and adjusting the number of periods of the RAS active times in the row refresh cycle time correspondingly via the refresh logic circuit according to a granularity specified by the memory controller in a fine granularity refresh mode.

Based on the above, the DRAM described in an embodiment of the invention may be optionally operated in the TCR mode or the FGR mode based on the control of the memory controller. In the TCR mode, the DRAM may correspondingly adjust the number of periods of a plurality of RAS active times in one row refresh cycle time according to the temperature of the DRAM (for example, the number of tRAS periods in one tRFC). For example, when the temperature is lower, the number of tRAS periods in one tRFC is smaller. That is, the lower the temperature, the smaller the number of refreshed memory cell rows in one tRFC. In the FGR mode of the DRAM, the number of periods of a plurality of RAS active times in one row refresh cycle time may be adjusted correspondingly according to the granularity specified by the memory controller. For example, when the granularity is finer, the number of tRAS periods in one tRFC is smaller. That is, the finer the granularity, the smaller the number of refreshed memory cell rows in one tRFC. Therefore, the DRAM may implement the TCR mode and the FGR mode.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
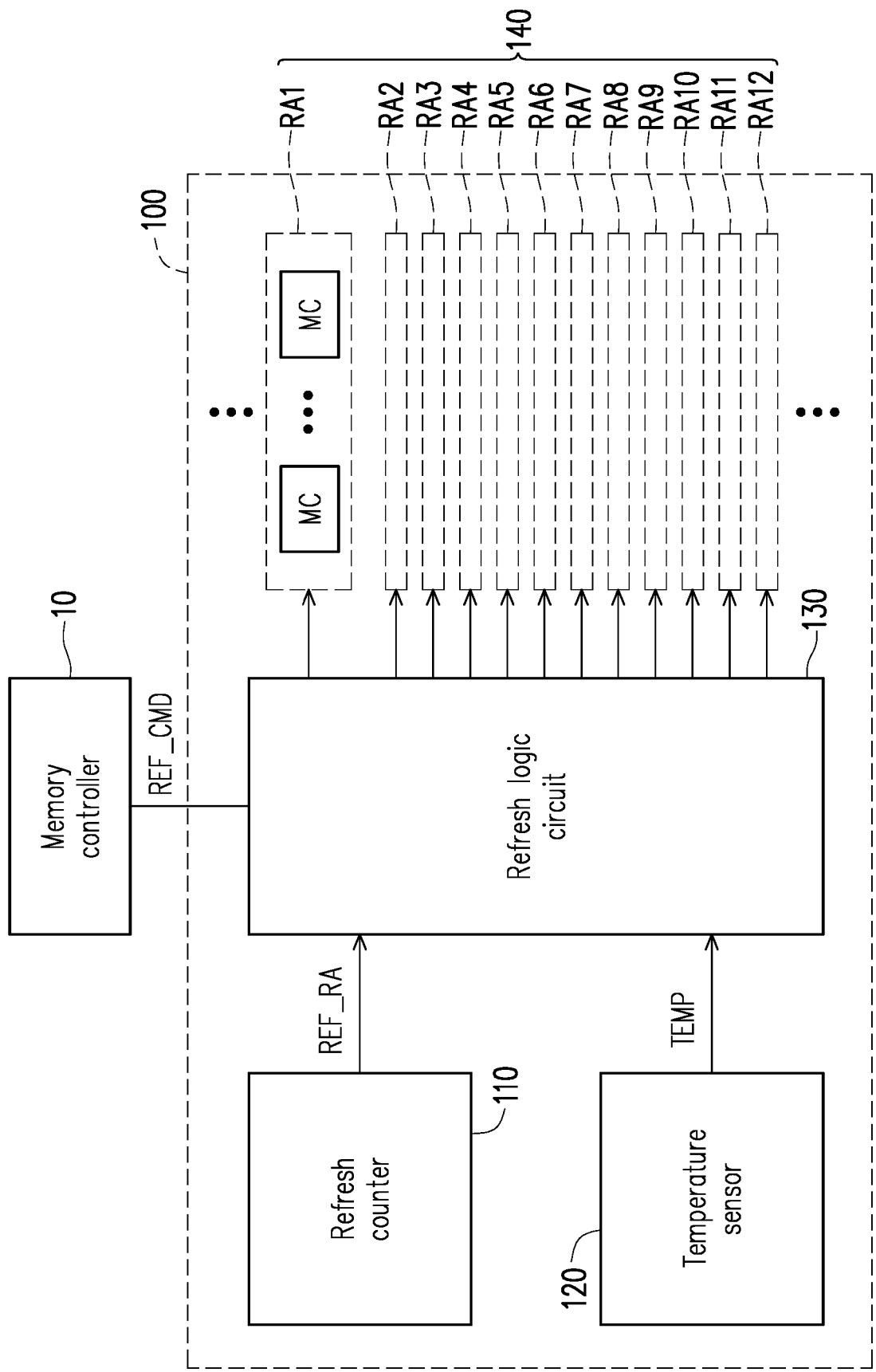
FIG. 1 is a circuit block diagram of a dynamic random-access memory (DRAM) according to an embodiment of the invention.

The term "coupled to (or connected to)" used in the entire text of the specification of the present application (including claims) may refer to any direct or indirect connecting means. For example, if the text describes a first device is coupled to (or connected to) a second device, then it should be understood that the first device may be directly connected to the second device, or the first device may be indirectly connected to the second device via other devices or certain connecting means. Terms such as "first" and "second" mentioned in the entire specification of the present application (including the claims) are used to name the elements or to distinguish different embodiments or ranges, and are not used to restrict the upper or lower limits of the number of elements, nor are they used to limit the order of the elements. Moreover, when applicable, elements/components/steps having the same reference numerals in figures and embodiments represent the same or similar parts. Elements/components/steps having the same reference numerals or having the same terminology in different embodiments may be cross-referenced.

FIG. 1 is a circuit block diagram of a dynamic random-access memory (DRAM) 100 according to an embodiment of the invention. A memory controller 10 may control and access the DRAM 100. The DRAM 100 shown in FIG. 1 includes a refresh counter 110, a temperature sensor 120, a refresh logic circuit 130, and a memory cell array 140. The memory cell array 140 includes a plurality of memory cell rows, such as memory cell rows RA1, RA1, RA2, RA3, RA4, RA5, RA6, RA7, RA8, RA9, RA10, RA11, and RA12 shown in FIG. 1. Each of the memory cell rows RA1 to RA12 includes a plurality of memory cell circuits MC. The present embodiment does not limit the specific implementation of the memory cell circuits MC. For example, according to actual design, the memory cell circuits MC may include a conventional memory cell or other memory cell circuits. For the sake of simplifying the figure, FIG. 1 does not depict the word lines, bit lines, and other circuits/elements of the memory cell array 140.

The refresh counter 110 is coupled to the refresh logic circuit 130 to provide a current refresh word line address REF_RA for an automatic refresh operation. In particular, the current refresh word line address REF_RA corresponds to one target row in the memory cell rows (for example, RA1 to RA12) of the memory cell array 140. According to the timing of scanning and refreshing the memory cell rows of the memory cell array 140, the refresh counter 110 may update the current refresh word line address REF_RA to point to the next memory cell row.

Figure 2:
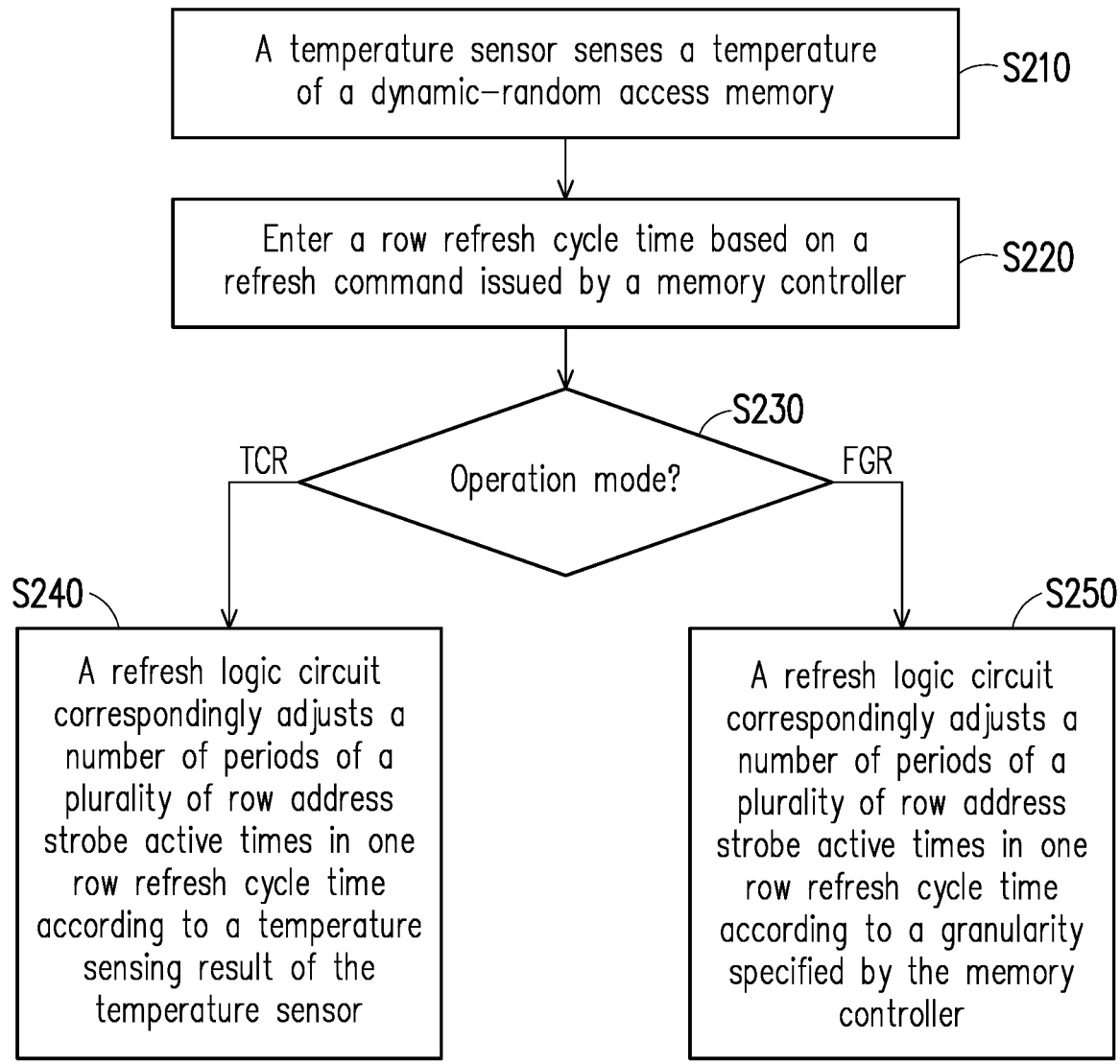
FIG. 2 is a schematic flowchart of an operation method of a dynamic random-access memory according to an embodiment of the invention.

FIG. 2 is a schematic flowchart of an operation method of a dynamic random-access memory (DRAM) according to an embodiment of the invention. Please refer to FIG. 1 and FIG. 2. In step S210, the temperature sensor 120 may sense the temperature of the DRAM 100, and then output a temperature sensing result TEMP to the refresh logic circuit 130. The refresh logic circuit 130 is coupled to the memory controller 10 to receive a refresh command REF_CMD. In step S220, based on the refresh command REF_CMD issued by the memory controller 10, the DRAM 100 may enter one row refresh cycle time. The row refresh cycle time may be "tRFC" specified by the DRAM standard. The definition of "tRFC" is known to those skilled in the art, and is therefore not repeated herein. In the row refresh cycle time, the refresh logic circuit 130 may perform an automatic refresh operation on at least one of the memory cell rows (for example, RA1 to RA12) of the memory cell array 140.

Each tRFC may include a plurality of row address strobe (RAS) active times. The RAS active time may be "tRAS" specified by the DRAM standard. The definition of "tRAS" is known to those skilled in the art, and is therefore not repeated herein. The number of tRAS in each tRFC may be different according to actual design. For example, in some embodiments, the number of tRAS in one tRFC may be 8. In each RAS active time, the refresh logic circuit 130 may perform an automatic refresh operation on one or a plurality of the memory cell rows (for example, RA1 to RA12) of the memory cell array 140. Specifically, the refresh counter 110 may respectively update the current refresh word line address REF_RA at the RAS active times (tRAS), and the refresh logic circuit 130 may refresh the target row corresponding to the updated current refresh word line address REF_RA at each of the RAS active times (tRAS).

Based on the control of the memory controller, the DRAM 100 may be optionally operated in a temperature-controlled refresh (TCR) mode or a fine granularity refresh (FGR) mode. When the DRAM 100 is operated in the TCR mode (the determination result of step S230 is "TCR"), the refresh logic circuit 130 may proceed to step S240. The refresh logic circuit 130 is coupled to the temperature sensor 120 to receive the temperature sensing result TEMP. In step S240, the refresh logic circuit 130 may correspondingly adjust the number of periods of a plurality of RAS active times (tRAS) in the row refresh cycle time (tRFC) according to the temperature sensing result TEMP of the temperature sensor 120. In some embodiments, the number of periods may be the number of tRAS periods configured in the same tRFC.

For example, when the temperature sensing result TEMP indicates that the temperature of the DRAM 100 is greater than a certain upper threshold, the refresh logic circuit 130 may configure X of the RAS active times (tRAS) in the row refresh cycle time (tRFC) according to the temperature sensing result TEMP in the TCR mode. In particular, X is an integer determined according to actual design (for example, 8 or other integers), and the upper threshold is one threshold temperature determined according to actual design (for example, 45° C. or other threshold temperatures). When the temperature sensing result TEMP indicates that the temperature of the DRAM 100 is between the upper threshold and a certain lower threshold, the refresh logic circuit 130 may configure Y of the RAS active times (tRAS) in the row refresh cycle time (tRFC) according to the temperature sensing result TEMP in the TCR mode. In particular, Y is an integer determined according to actual design and Y is less than X (for example, Y is 4 or other integers), and the lower threshold is another threshold temperature determined according to actual design and the upper threshold is greater than the lower threshold (for example, the lower threshold is 0° C. or other threshold temperatures). When the temperature sensing result TEMP indicates that the temperature of the DRAM 100 is less than the lower threshold, the refresh logic circuit 130 may configure Z of the RAS active times (tRAS) in the row refresh cycle time (tRFC) according to the temperature sensing result TEMP in the TCR mode. In particular, Z is an integer determined according to actual design and Z is less than Y (for example, Z is 2 or other integers).

Based on the above, in the TCR mode, the DRAM 100 may correspondingly adjust the number of periods of a plurality of RAS active times (tRAS) in one row refresh cycle time (tRFC) according to the temperature of the DRAM 100. When the temperature is lower, the number of tRAS periods in one tRFC is smaller. For example, when the temperature of the DRAM 100 is greater than 45° C., the refresh logic circuit 130 may configure 8 tRAS periods in one tRFC. When the temperature of the DRAM 100 is between 45° C. and 0° C., the refresh logic circuit 130 may configure 4 tRAS periods in one tRFC. When the temperature of the DRAM 100 is less than 0° C., the refresh logic circuit 130 may configure 2 tRAS periods in one tRFC. That is, the lower the temperature, the smaller the number of refreshed memory cell rows in one tRFC. Therefore, the DRAM 100 may implement the TCR mode.

When the DRAM 100 is operated in the FGR mode (the determination result of step S230 is "FGR"), the refresh logic circuit 130 may proceed to step S250. In step S250, the refresh logic circuit 130 may correspondingly adjust the number of periods of a plurality of RAS active times (tRAS) in the row refresh cycle time (tRFC) according to the granularity specified by the memory controller 10. In some embodiments, the number of periods may be the number of tRAS periods configured in the same tRFC.

For example, in some embodiments, the memory controller 10 specifies the granularity as one of the original granularity (x1 granularity), double granularity, and quadruple granularity. When the memory controller 10 specifies the granularity as the "original granularity", the refresh logic circuit 130 may configure N of the RAS active times (tRAS) in the row refresh cycle time (tRFC). In particular, N is an integer determined according to actual design (for example, 8 or other integers). When the memory controller 10 specifies the granularity as the "double granularity", the refresh logic circuit 130 may configure int(N/2) of the RAS active times (tRAS) in the row refresh cycle time (tRFC). In particular, int() into is an integer function. When the memory controller 10 specifies the granularity as the "quadruple granularity", the refresh logic circuit 130 may configure int(N/4) of the RAS active times (tRAS) in the row refresh cycle time (tRFC).

Based on the above, in the FGR mode of the DRAM 100, the number of periods of a plurality of RAS active times (tRAS) in one row refresh cycle time (tRFC) may be adjusted correspondingly according to the granularity specified by the memory controller 10. When the granularity is finer, the number of tRAS periods in one tRFC is smaller. For example, when the memory controller 10 specifies the granularity as the "original granularity", the refresh logic circuit 130 may configure 8 tRAS in one tRFC. When the memory controller 10 specifies the granularity as the "double granularity", the refresh logic circuit 130 may configure 4 tRAS in one tRFC. When the memory controller 10 specifies the granularity as the "quadruple granularity", the refresh logic circuit 130 may configure 2 tRAS in one tRFC. That is, the finer the granularity, the smaller the number of refreshed memory cell rows in one tRFC. Therefore, the DRAM 100 may implement the FGR mode.

Figure 3:
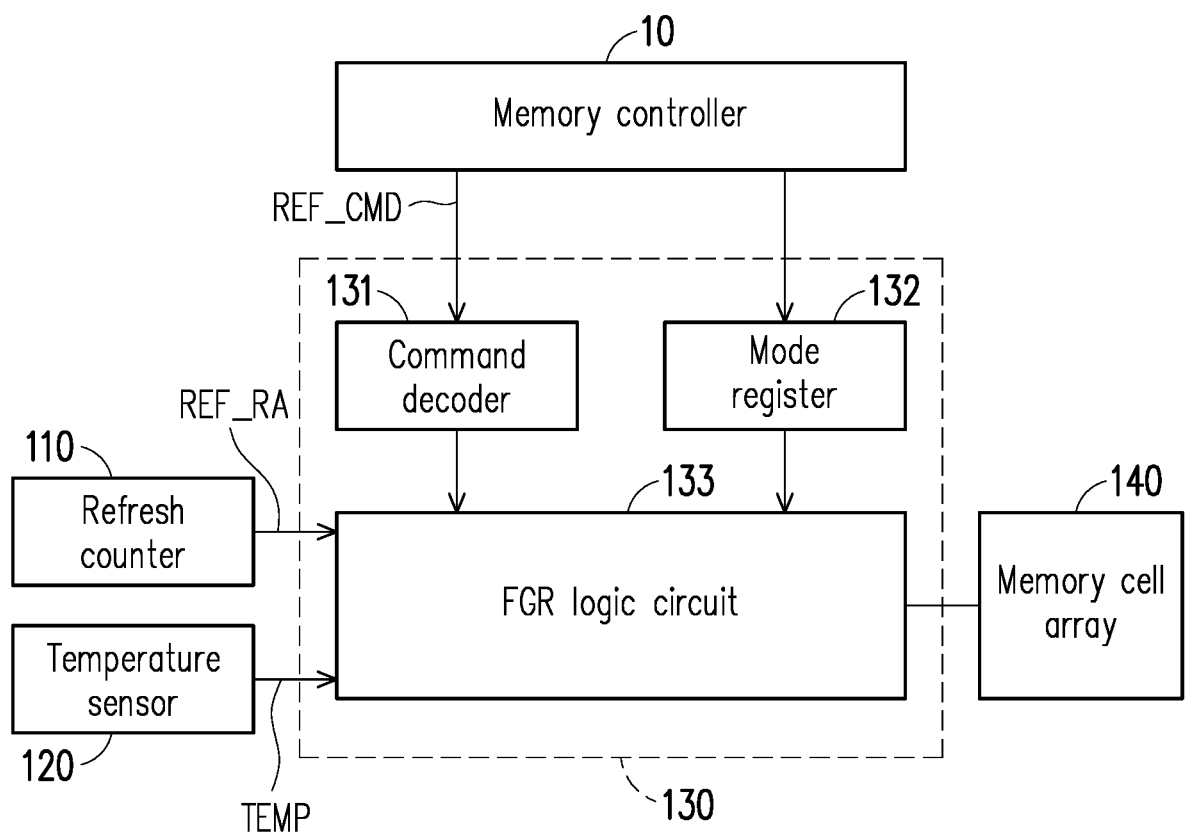
FIG. 3 is a circuit block diagram of a refresh logic circuit according to an embodiment of the invention.

FIG. 3 is a circuit block diagram of the refresh logic circuit 130 according to an embodiment of the invention. The memory controller 10, the refresh counter 110, the temperature sensor 120, the refresh logic circuit 130, and the memory cell array 140 shown in FIG. 3 are as provided in the related description of FIG. 1, and are therefore not repeated herein. In the embodiment shown in FIG. 3, the refresh logic circuit 130 includes a command decoder 131, a mode register 132, and a fine granularity refresh (FGR) logic circuit 133. The mode register 132 may record the granularity specified by the memory controller 10 and the operation mode of the DRAM 100. The command decoder 131 may decode the refresh command REF_CMD of the memory controller 10, and then provide the decoded result of the refresh command REF_CMD to the FGR logic circuit 133.

The FGR logic circuit 133 is coupled to the refresh counter 110, the temperature sensor 120, the command decoder 131, and the mode register 132. When the content of the mode register 132 indicates "the operation mode of the DRAM 100 is the TCR mode", the FGR logic circuit 130 may correspondingly adjust the number of periods of a plurality of RAS active times (tRAS) in the row refresh cycle time (tRFC) according to the temperature sensing result TEMP of the temperature sensor 120. When the temperature is lower, the number of tRAS periods in one tRFC is smaller. For example, when the temperature of the DRAM 100 is greater than 45° C., the FGR logic circuit 133 may configure 8 tRAS periods in one tRFC. When the temperature of the DRAM 100 is between 45° C. and 0° C., the FGR logic circuit 133 may configure 4 tRAS periods in one tRFC. When the temperature of the DRAM 100 is less than 0° C., the FGR logic circuit 133 may configure 2 tRAS periods in one tRFC. That is, the lower the temperature, the smaller the number of refreshed memory cell rows in one tRFC.

When the content of the mode register 132 indicates "the operation mode of the DRAM 100 is the FGR mode", the FGR logic circuit 133 may correspondingly adjust the number of periods of a plurality of RAS active times (tRAS) in the row refresh cycle time (tRFC) according to the granularity recorded in the mode register 132 (the granularity is specified by the memory controller 10). When the granularity is finer, the number of tRAS periods in one tRFC is smaller. For example, when the memory controller 10 specifies the granularity as the "original granularity" (x1 granularity), the refresh logic circuit 130 may configure 8 tRAS in one tRFC. When the memory controller 10 specifies the granularity as the "double granularity", the refresh logic circuit 130 may configure 4 tRAS in one tRFC. When the memory controller 10 specifies the granularity as the "quadruple granularity", the refresh logic circuit 130 may configure 2 tRAS in one tRFC. That is, the finer the granularity, the smaller the number of refreshed memory cell rows in one tRFC.

According to different design requirements, the refresh counter 110, the refresh logic circuit 130, the command decoder 131, and/or the FGR logic circuit 133 may be implemented by hardware, firmware, software (i.e., program), or a combination of the three. For example, the refresh counter 110, the refresh logic circuit 130, the command decoder 131, and/or the FGR logic circuit 133 may be implemented in a logic circuit on an integrated circuit. Related functions of the refresh counter 110, the refresh logic circuit 130, the command decoder 131, and/or the FGR logic circuit 133 may be implemented as hardware using a hardware description language (for example, Verilog HDL or VHDL) or other suitable programming languages. Related functions of the refresh counter 110, the refresh logic circuit 130, the command decoder 131, and/or the FGR logic circuit 133 may be implemented in one or a plurality of controllers, microcontrollers, microprocessors, application-specific integrated circuits (ASICs), digital signal processors (DSPs), field-programmable gate arrays (FPGAs), and/or various logic blocks, modules, and circuits in other processing units.

Based on the above, the DRAM 100 described in an embodiment may be optionally operated in the TCR (temperature-controlled refresh) mode or the FGR (fine granularity refresh) mode based on the control of the memory controller. In the TCR mode, the DRAM 100 may correspondingly adjust the number of periods of a plurality of RAS active times (tRAS) in one row refresh cycle time (tRFC) according to the temperature of the DRAM 100. For example, when the temperature is lower, the number of tRAS periods in the same tRFC is smaller. That is, the lower the temperature, the smaller the number of refreshed memory cell rows in the same tRFC. In the FGR mode of the DRAM 100, the number of periods of a plurality of RAS active times (tRAS) in one row refresh cycle time (tRFC) may be adjusted correspondingly according to the granularity specified by the memory controller 10. For example, when the granularity is finer, the number of tRAS periods in the same tRFC is smaller. That is, the finer the granularity, the smaller the number of refreshed memory cell rows in the same tRFC. Therefore, the DRAM 100 may implement the TCR mode and the FGR mode.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A dynamic random-access memory, comprising:
a memory cell array, comprising a plurality of memory cell rows;
a temperature sensor configured to sense a temperature of the dynamic random-access memory; and
a refresh logic circuit, coupled to the temperature sensor to receive a temperature sensing result, and configured to enter a row refresh cycle time based on a refresh command issued by a memory controller to perform an automatic refresh operation on at least one of the memory cell rows, wherein,
in a temperature-controlled refresh mode, the refresh logic circuit correspondingly adjusts a number of periods of a plurality of row address strobe active times in the row refresh cycle time according to the temperature sensing result; and
in a fine granularity refresh mode, the refresh logic circuit correspondingly adjusts the number of periods of the row address strobe active times in the row refresh cycle time according to a granularity specified by the memory controller,
wherein the row address strobe active times are tRAS specified by a dynamic random-access memory standard, the row refresh cycle time is a tRFC specified by the dynamic random-access memory standard, and the number of periods is a number of tRAS periods configured in a same tRFC.

2. The dynamic random-access memory of claim 1, further comprising:
a refresh counter coupled to the refresh logic circuit to provide a current refresh word line address of the automatic refresh operation, wherein the current refresh word line address corresponds to a target row in the memory cell rows, the refresh counter updates the current refresh word line address at the row address strobe active times, respectively, and the refresh logic circuit refreshes the target row corresponding to the current refresh word line address at each of the row address strobe active times.

3. The dynamic random-access memory of claim 1, wherein,
the refresh logic circuit configures X of the row address strobe active times in the row refresh cycle time according to the temperature sensing result in the temperature control refresh mode when the temperature sensing result indicates that the temperature of the dynamic random-access memory is greater than an upper threshold, wherein X is an integer;
the refresh logic circuit configures Y of the row address strobe active times in the row refresh cycle time according to the temperature sensing result in the temperature control refresh mode when the temperature sensing result indicates that the temperature of the dynamic random-access memory is between the upper threshold and a lower threshold, wherein Y is an integer less than X, and the upper threshold is greater than the lower threshold; and
the refresh logic circuit configures Z of the row address strobe active times in the row refresh cycle time according to the temperature sensing result in the temperature control refresh mode when the temperature sensing result indicates that the temperature of the dynamic random-access memory is less than the lower threshold, wherein Z is an integer less than Y.

4. The dynamic random-access memory of claim 1, wherein the granularity is one of an original granularity, a double granularity, and a quadruple granularity,
the refresh logic circuit configures N of the row address strobe active times in the row refresh cycle time according to the granularity in the fine granularity refresh mode when the memory controller specifies the granularity as the original granularity, wherein N is an integer;
the refresh logic circuit configures int(N/2) of the row address strobe active times in the row refresh cycle time according to the granularity in the fine granularity refresh mode when the memory controller specifies the granularity as the double granularity, wherein int() is an integer function; and
the refresh logic circuit configures int(N/4) of the row address strobe active times in the row refresh cycle time according to the granularity in the fine granularity refresh mode when the memory controller specifies the granularity as the quadruple granularity.

5. The dynamic random-access memory of claim 1, wherein the refresh logic circuit comprises:
a mode register configured to record the granularity specified by the memory controller and an operation mode of the dynamic random-access memory;
a command decoder configured to decode the refresh command of the memory controller; and
a fine granularity refresh logic circuit coupled to the temperature sensor, the mode register, and the command decoder, wherein,
when a content of the mode register indicates that the operation mode of the dynamic random-access memory is the temperature-controlled refresh mode, the fine granularity refresh logic circuit correspondingly adjusts the number of periods of the row address strobe active times in the row refresh cycle time according to the temperature sensing result; and
when a content of the mode register indicates that the operation mode of the dynamic random-access memory is the fine granularity refresh mode, the fine granularity refresh logic circuit correspondingly adjusts the number of periods of the row address strobe active times in the row refresh cycle time according to the granularity.

6. An operation method of a dynamic random-access memory, comprising:
sensing a temperature of the dynamic random-access memory by a temperature sensor of the dynamic random-access memory;
entering a row refresh cycle time based on a refresh command issued by a memory controller to perform an automatic refresh operation on at least one of a plurality of memory cell rows of a memory cell array of the dynamic random-access memory;
adjusting, by a refresh logic circuit of the dynamic random-access memory, a number of periods of a plurality of row address strobe active times in the row refresh cycle time correspondingly according to a temperature sensing result of the temperature sensor in a temperature-controlled refresh mode; and
adjusting, by the refresh logic circuit, the number of periods of the row address strobe active times in the row refresh cycle time correspondingly according to a granularity specified by the memory controller in a fine granularity refresh mode, wherein the row address strobe active times are tRAS specified by a dynamic random-access memory standard, the row refresh cycle time is a tRFC specified by the dynamic random-access memory standard, and the number of periods is a number of tRAS periods configured in a same tRFC.

7. The operation method of claim 6, further comprising:
providing, by a refresh counter of the dynamic random-access memory, a current refresh word line address of the automatic refresh operation, wherein the current refresh word line address corresponds to a target row in the memory cell rows;
updating, by the refresh counter, the current refresh word line address respectively at the row address strobe active times; and
refreshing, by the refresh logic circuit, the target row corresponding to the current refresh word line address at each of the row address strobe active times.

8. The operation method of claim 6, further comprising:
configuring, by the refresh logic circuit, X of the row address strobe active times in the row refresh cycle time according to the temperature sensing result in the temperature control refresh mode when the temperature sensing result indicates that the temperature of the dynamic random-access memory is greater than an upper threshold, wherein X is an integer;
configuring, by the refresh logic circuit, Y of the row address strobe active times in the row refresh cycle time according to the temperature sensing result in the temperature control refresh mode when the temperature sensing result indicates that the temperature of the dynamic random-access memory is between the upper threshold and a lower threshold, wherein Y is an integer less than X, and the upper threshold is greater than the lower threshold; and
configuring, by the refresh logic circuit, Z of the row address strobe active times in the row refresh cycle time according to the temperature sensing result in the temperature control refresh mode when the temperature sensing result indicates that the temperature of the dynamic random-access memory is less than the lower threshold, wherein Z is an integer less than Y.

9. The operation method of claim 6, wherein the granularity is one of an original granularity, a double granularity, and a quadruple granularity, and the operation method further comprises:
configuring, by the refresh logic circuit, N of the row address strobe active times in the row refresh cycle time according to the granularity in the fine granularity refresh mode when the memory controller specifies the granularity as the original granularity, wherein N is an integer;
configuring, by the refresh logic circuit, int(N/2) of the row address strobe active times in the row refresh cycle time according to the granularity in the fine granularity refresh mode when the memory controller specifies the granularity as the double granularity, wherein int() is an integer function; and
configuring, by the refresh logic circuit, int(N/4) of the row address strobe active times in the row refresh cycle time according to the granularity in the fine granularity refresh mode when the memory controller specifies the granularity as the quadruple granularity.

10. The operation method of claim 6, further comprising:
recording the granularity specified by the memory controller and an operation mode of the dynamic random-access memory via a mode register of the refresh logic circuit;
decoding the refresh command of the memory controller via a command decoder of the refresh logic circuit; and
adjusting the number of periods of the row address strobe active times in the row refresh cycle time correspondingly via a fine granularity refresh logic circuit of the refresh logic circuit according to the temperature sensing result when a content of the mode register indicates that the operation mode of the dynamic random-access memory is the temperature-controlled refresh mode; and
adjusting the number of periods of the row address strobe active times in the row refresh cycle time correspondingly via the fine granularity refresh logic circuit according to the granularity when the content of the mode register indicates that the operation mode of the dynamic random-access memory is the fine granularity refresh mode.

\* \* \* \* \*